(12) United States Patent
Murata et al.

(10) Patent No.: US 9,454,232 B2
(45) Date of Patent: Sep. 27, 2016

(54) OPERATING DEVICE

(71) Applicant: KABUSHIKI KAISHA TOKAI RIKA DENKI SEISAKUSHO, Aichi (JP)

(72) Inventors: Kenji Murata, Aichi (JP); Masaki Yoshino, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 13 days.

(21) Appl. No.: 14/455,226

(22) Filed: Aug. 8, 2014

(65) Prior Publication Data

US 2015/0068880 A1 Mar. 12, 2015

(51) Int. Cl.
| | | |
|---|---|---|
| *G08B 6/00* | (2006.01) | |
| *G06F 3/16* | (2006.01) | |
| *G06F 3/01* | (2006.01) | |
| *G06F 3/041* | (2006.01) | |
| *H03K 17/96* | (2006.01) | |
| *H01H 3/00* | (2006.01) | |

(52) U.S. Cl.
CPC ............... *G06F 3/016* (2013.01); *G06F 3/041* (2013.01); *H03K 17/962* (2013.01); *H01H 2003/008* (2013.01); *H03K 2217/96054* (2013.01); *H03K 2217/96062* (2013.01)

(58) Field of Classification Search
CPC ................. H01H 13/24; H01H 13/84; H01H 2215/028; H01H 2215/05; H01H 2239/026; G06F 3/041; G06F 3/016
USPC .............................. 345/173; 340/407.1, 407.2
See application file for complete search history.

(56) References Cited

U.S. PATENT DOCUMENTS

| | | | | |
|---|---|---|---|---|
| 2010/0225263 | A1* | 9/2010 | Mishima | H02P 7/29 318/430 |
| 2011/0050404 | A1* | 3/2011 | Nakamura | G06F 3/016 340/407.1 |
| 2011/0121780 | A1* | 5/2011 | Fukuo | B60L 3/0069 320/109 |

(Continued)

FOREIGN PATENT DOCUMENTS

| | | | |
|---|---|---|---|
| GB | 2423846 | 9/2006 | |
| JP | 2010-204741 | 9/2010 | |
| JP | 5236832 | * 7/2013 | ............. G06F 3/016 |

OTHER PUBLICATIONS

Extended International European Search Report Application No. 14182090.2 dated Jan. 29, 2015.

*Primary Examiner* — Andrew Bee
*Assistant Examiner* — Mancil Littlejohn, Jr.
(74) *Attorney, Agent, or Firm* — Roberts Mlotkowski Safran Calderon & Cole, PC (57) ABSTRACT

An operating device includes a push operation mechanism including an operating portion to be push-operated, a tactile presenting means that drives the operating portion, a detecting portion for detecting movement of the operating portion, and a drive control unit that drives the driving portion by a drive control signal and a main vibration pulse signal output after outputting the drive control signal, the drive control signal being generated based on a start pulse signal and a pre-vibration pulse signal. The drive control unit sets a mask time to invalidate a detection signal of the detecting portion in a certain period when the drive control signal is output and switches from the output of the drive control signal to the output of the main vibration pulse signal based on a detection signal of the detecting portion after an elapse of the mask time.

10 Claims, 7 Drawing Sheets

(56) References Cited

U.S. PATENT DOCUMENTS

2014/0104209 A1* 4/2014 Ueno ............... H01H 3/12
 345/173

2015/0035773 A1* 2/2015 Fujii ............... G06F 3/04886
 345/173

* cited by examiner

FIG.1

20 TOUCH PANEL DEVICE
23 TOUCH SENSOR SUBSTRATE
30 PUSH OPERATION MECHANISM
40 TACTILE PRESENTING DEVICE
41 DRIVE TRANSMISSION MECHANISM

OPERATING DEVICE

The present application is based on Japanese patent application No. 2013-189041 filed on Sep. 12, 2013, the entire contents of which are incorporated herein by reference.

BACKGROUND OF THE INVENTION

1. Field of the Invention

The invention relates to an operating device, and in particular, to an operating device having a function of presenting tactile stimuli-operational feeling to an operator.

2. Related Art

A direction indicating device for indicating a direction using, e.g., a tilt of a finger of an operator has been proposed as an example of a conventional information presentation device for transmitting information to an operator (see e.g. JP-A-2010-204741).

The conventional direction indicating device described in JP-A-2010-204741 is configured that a finger placing plate arranged on upper surfaces of plural movable panels which are independently vertically movable is inclined corresponding to a traveling direction displayed on a screen of a car navigation device. Movable portions for driving the movable panels are bar-shaped members which protrude downwards from the movable panels and are with tip portions constantly slidably in contact with an outer peripheral surface of a cam fixed to a rotary shaft of a drive motor, and back and forth rotation of the cam by forward and backward rotary drive of the drive motor moves the movable panels vertically.

SUMMARY OF THE INVENTION

The conventional direction indicating device described in JP-A-2010-204741 is configured to start a direction indicating operation in a state that the bar-shaped members of the movable panels are constantly in contact with the cam of the drive motor. Therefore, there is a problem that, when the movable panels are push-operated, cogging torque of the motor acts as a resistive force against the push-operated movable panels and this impairs operational feeling of the movable panels.

In this regard, the cam of the drive motor may be configured to be retracted from the position in contact with the bar-shaped members of the movable panels to the position not in contact with the bar-shaped members when the direction indicating operation of the movable panels is not required, so the influence of the cogging torque of the motor is avoided. However, even if a sensor for detecting a rotation angle of the drive motor is provided, the movement of the movable panels is not detected as long as the cam of the drive motor is not in contact with the bar-shaped members of the movable panels, and it is thus difficult to control the timing to start the direction indicating operation based on the rotary drive of the motor.

On the other hand, when controlling the timing to start the direction indicating operation not based on the rotation angle of the drive motor detected by the sensor but based on the movement of the movable panel detected by the sensor, there is a problem that the timing to start controlling the direction indicating operation is misjudged when the movable panels are moved by an operation other than the operation by the cam between the position at which the cam of the drive motor is not in contact with the bar-shaped members and the position at which the cam is in contact with the bar-shaped members.

It is an object of the invention to provide an operating device that allows an information presentation operation at appropriate start timing.

(1) According to one embodiment of the invention, an operating device comprises:

a push operation mechanism comprising an operating portion to be push-operated;

a tactile presenting means that drives the operating portion by a driving portion via the push operation mechanism to provide an operational feeling;

a detecting portion for detecting movement of the operating portion; and a drive control unit that drives the driving portion by a drive control signal and a main vibration pulse signal output after outputting the drive control signal, the drive control signal being generated based on a start pulse signal and a pre-vibration pulse signal with a predetermined number of pulses smaller than the pulse of the start pulse signal, wherein the drive control unit sets a mask time to invalidate a detection signal of the detecting portion in a certain period when the drive control signal is output and switches from the output of the drive control signal to the output of the main vibration pulse signal based on a detection signal of the detecting portion after an elapse of the mask time.

In the above embodiment (1) of the invention, the following modifications and changes can be made.

(i) The mask time is set to be a first mask time elapsing from a start to a stop of an output of a start pulse signal.

(ii) The mask time is set to be a second mask time, where a first mask time elapsing from a start to a stop of an output of a start pulse signal is a minimum time and the second mask time is a time more than the minimum time and elapsing from the start of the output of the start pulse signal to a start of an output of a pre-vibration pulse signal, and wherein the second mask time is updated by an average value calculated from a last n times of stored history information of the second mask time.

(iii) The second time is set to be a time until change to (Hfb1−Hfb0)>HfbST occurs, where Hfb0 is a value detected by the detecting portion at a point during the first mask time, Hfb1 is a value detected by the detecting portion at a point during the second mask time and HfbST is a value detected by the detecting portion after elapse of the second mask time.

(iv) The drive control unit controls such that the main vibration pulse signal is output when a value Hfb1 detected by the detecting portion at a point during the second mask time is greater than a value HfbST detected by the detecting portion after elapse of the second mask time, and the main vibration pulse signal is not output when the value Hfb1 detected by the detecting portion at a point during the second mask time is less than the value HfbST detected by the detecting portion after elapse of the second mask time.

(v) The mask time is set as time resulting from updating a value that is derived by subtracting a correction value from the average value of the second mask time.

(vi) The operating portion comprises a touch panel.

(vii) The push operation mechanism comprises the detecting portion.

(viii) The detecting portion comprises an encoder to detect a position of the push operation mechanism and an enter switch to detect presence of push operation to the push operation mechanism.

(ix) The switching from the output of the drive control signal to the output of the main vibration pulse signal is conducted only based on a detection signal of the detecting portion.

Effects of the Invention

According to one embodiment of the invention, an operating device can be provided that allows an information presentation operation at appropriate start timing such that an operator thereof does not feel uncomfortable.

BRIEF DESCRIPTION OF THE DRAWINGS

Next, the present invention will be explained in more detail in conjunction with appended drawings, wherein.

DESCRIPTION OF THE PREFERRED EMBODIMENTS

Preferred embodiments of the invention will be specifically described below in conjunction with the appended drawings.

First Embodiment

Overall Structure of Operating Device

Figure 1:
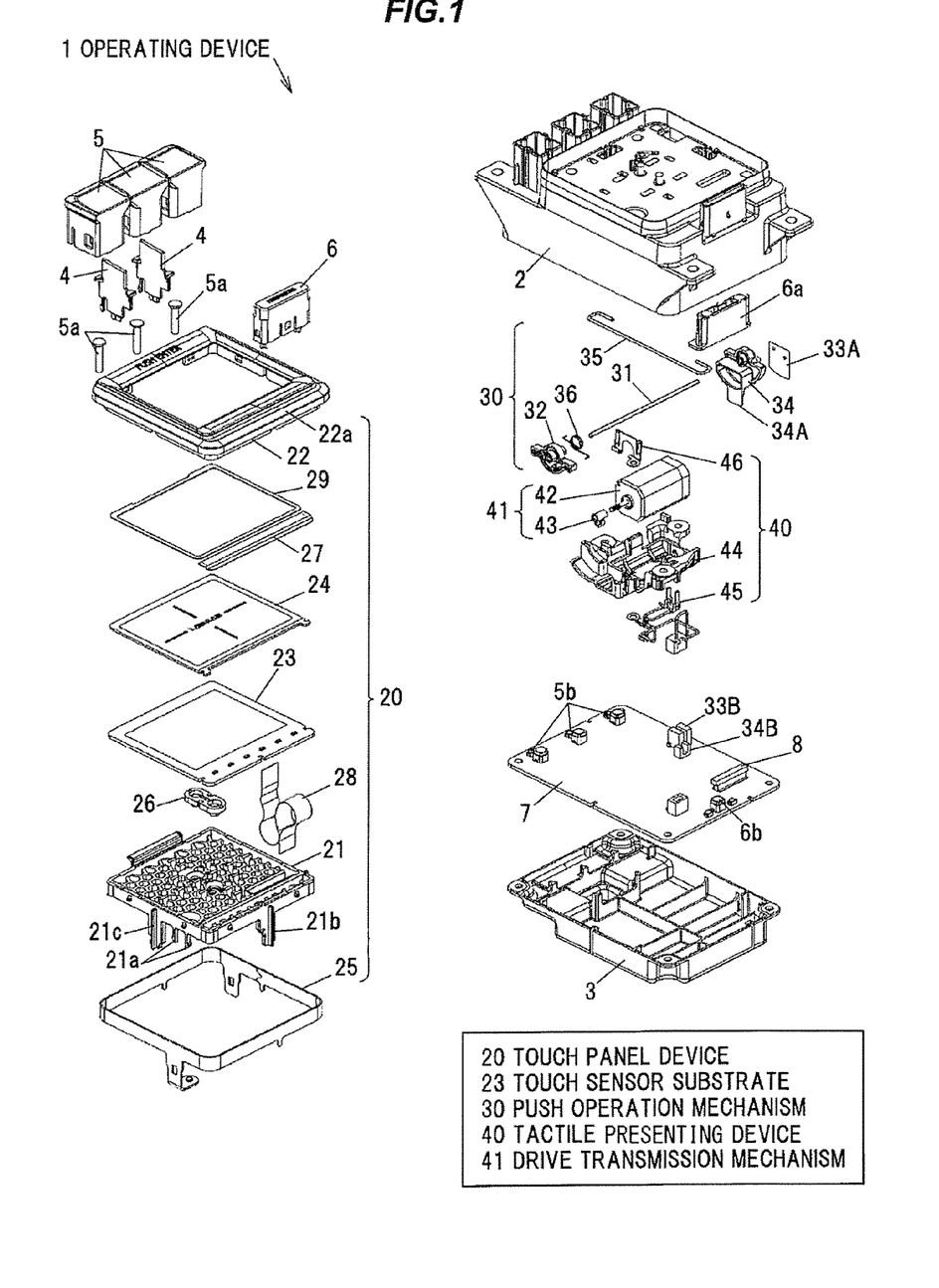
FIG. 1 is a schematic exploded perspective view showing a typical operating device provided with a tactile presenting device in a first embodiment of the present invention.
Figures 2A, 2B, 2C:
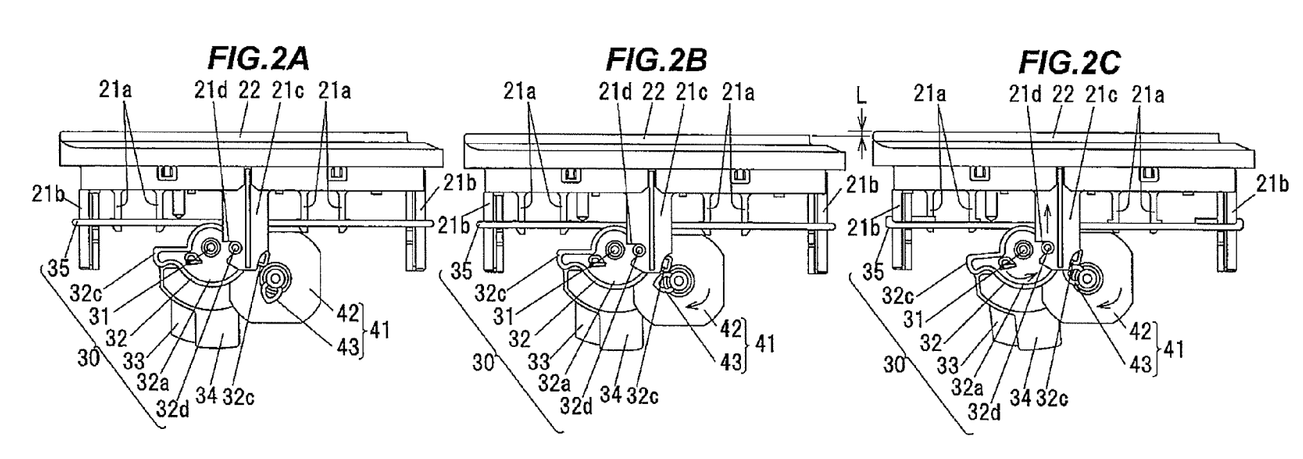
FIGS. 2A to 2C are explanatory diagrams illustrating an operation of the tactile presenting device during vibration feedback.

In FIG. 1, a typical operating device provided with a tactile presenting device in the first embodiment is indicated generally by the reference numeral 1 and components of the operating device are schematically shown as an example. The operating device 1 is suitably used as, but not specifically limited to, a vehicle touch panel which outputs operation signals for controlling operation of on-vehicle equipments, e.g., air-conditioning systems, audio systems or navigation systems, etc.

The operating device 1 in the illustrated example is arranged on a periphery of a driver's seat such as a non-illustrated center console in a car compartment and is connected to a non-illustrated display via a wiring.

The operating device 1 is configured as a remote control input device in which a touch operation of a touch panel by a finger of an operator causes, e.g., a touch sensor to detect a touch position on a surface of the touch panel and to output a position detection signal corresponding to the detected position to select and determine an item button on a display.

As shown in FIG. 1, the operating device 1 is provided with a touch panel device 20 which can be push-operated and a tactile presenting device 40 which presents vibration stimuli-operational feeling (haptic feeling) to a finger of an operator when the touch panel device 20 is operated and receives an input.

Respective components of the touch panel device 20 and the tactile presenting device 40 are fitted into a resin body 2 formed in a case shape which opens downward, as shown in FIG. 1. A resin cover body 3 covering the lower opening of the body 2 is fastened and fixed by non-illustrated screws, thereby forming the operating device 1 in which the touch panel device 20 and the tactile presenting device 40 are integrated.

As shown in FIG. 1, three (first to third) operating knobs 5, 5, 5 are provided in line on one side of the body 2. Resin separators 4, 4 as insulations are interposed between adjacent operating knobs 5. A fourth operating knob 6 is provided on another side of the body 2. The first to fourth operating knobs 5 and 6 are arranged so that push switches 5b and 6b mounted on a control board 7 can be respectively turned on and off via pushers 5a and 6a. The operation information from the push switches 5b and 6b is output to an electronic device, thereby remotely operating the electronic device.

Structure of Touch Panel Device

As shown in FIG. 1, the touch panel device 20 is assembled in a state that a rectangular touch sensor substrate 23 and a sheet-like touch panel 24 are joined by a non-illustrated double-sided tape between a base 21 having a rectangular shape in a plan view and a frame 22 having a frame shape. The base 21 and the frame 22 are formed of a resin material. A rectangular frame-shaped shield member 25 is arranged so as to cover an outer periphery of the touch panel device 20. The shield member 25 is electrically connected to a ground circuit of the control board 7.

A recessed portion having a recessed shape is formed on an upper surface of the base 21 and the touch sensor substrate 23 is resiliently supported on a bottom surface of the recessed portion via a click member 26, as shown in FIG. 1. The click member 26 is formed of a cylindrical rubber material displaceable with respect to the touch panel 24 due to elastic deformation, and is formed so that an inner diameter on the touch panel 24 side is larger than that on the base 21 side.

The frame 22 is formed of a frame portion 22a providing an opening on the upper surface, as shown in FIG. 1. The frame portion 22a has a plate frame having a picture frame shape and a cylindrical wall portion extending from an edge of the inner periphery of the plate frame toward a housing portion.

As shown in FIG. 1, the touch sensor substrate 23 is connected to the touch panel 24 via a conductive tape 27 which is an electrically conductive material.

As shown in FIG. 1, the touch sensor substrate 23 is, e.g., a capacitive touch sensor for detecting capacitance and is connected, via a flexible flat cable 28, to a connector 8 mounted on the control board 7.

Meanwhile, as shown in FIG. 1, the touch panel 24 is attached to the back side of the plate frame of the frame 22 by a double-sided tape 29 having sealing properties and is operably arranged such that an operation surface is exposed in an opening of the frame portion 22a of the frame 22. The operation information from the touch panel 24 as an operating portion is output to an electronic device, thereby remotely operating the electronic device.

Furthermore, as shown in FIG. 1, plural elastic engaging pieces 21a . . . 21a to be engaged with through-holes formed on the body 2, a pair of guide pieces 21b, 21b guiding and moving along guide holes formed on the body 2 and a coupling piece 21c as a coupling member moving in conjunction with reciprocating movement of the touch panel 24 are formed on the base 21 so as to respectively extend toward a push operation mechanism 30.

Structure of Push Operation Mechanism

As shown in FIG. 1, the push operation mechanism 30 is provided with a support shaft 31 rotatably fixed to the body 2 and a linking member 32 which rotates integrally with one end of the support shaft 31. A plate-like encoder 33 as a detection portion for detecting a position of the linking member 32 and an enter switch 34 for detecting presence/absence of the push operation are attached to another end of the support shaft 31.

As shown in FIG. 1, the encoder 33 is a rotary encoder composed of an encoder slit plate 33A attached to the push operation mechanism 30 and a photo interrupter 33B attached to the control board 7. The encoder slit plate 33A rotates with vertical movement of the base 21 of the touch panel device 20 and thus detects, with high resolution, movement of the touch panel 24 as an operating portion fixed to the base 21.

Figure 4:
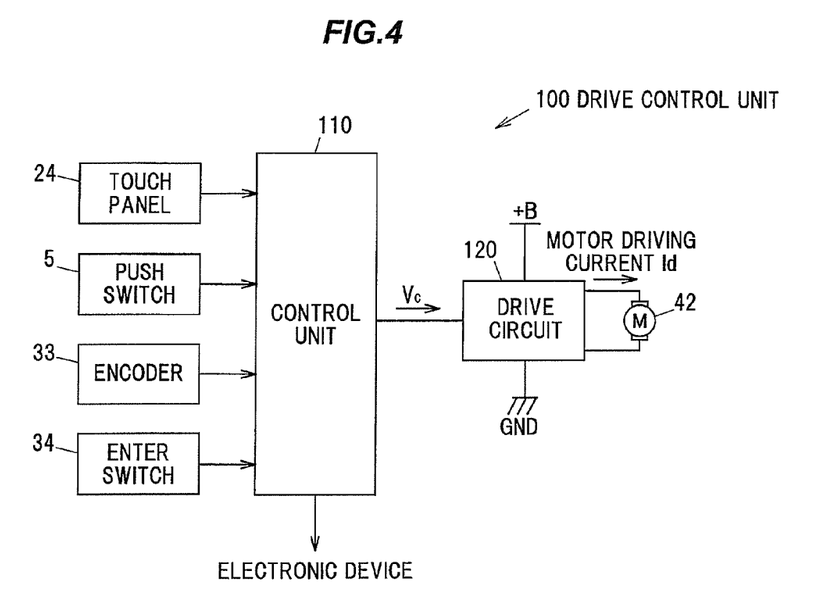
FIG. 4 is a block diagram illustrating an electrical system, mainly a drive control unit, of the tactile presenting device.

As shown in FIG. 1, the enter switch 34 is composed of an enter switch board 34A attached to the push operation mechanism 30 and a photo interrupter 34B attached to the control board 7. The enter switch board 34A is attached to the support shaft 31 and thus detects an enter operation of the touch panel 24 which is fixed to the base 21. A detection signal of the enter switch 34 is input to a control unit 110, as shown in FIG. 4.

The push operation mechanism 30 is further provided with a stabilizer 35 for suppressing a tilting operation of the touch panel 24 during the push operation, as shown in FIG. 1. The stabilizer 35 is attached to the pair of guide pieces 21b of the touch panel device 20 at both ends respectively so as to intersect with the support shaft 31, thereby suppressing the tilting operation around the support shaft 31.

A torsion spring 36 is attached to the linking member 32, as shown in FIG. 1. The torsion spring 36 is configured to constantly bias the linking member 32 in one direction. The support shaft 31 and the torsion spring 36 are formed of a metal material and the linking member 32 is formed of a resin material.

As shown in FIGS. 2A to 3A, the linking member 32 has a doughnut-shaped basal portion 32a having a support shaft-insertion hole 32b and a pair of arm portions 32c, 32c which are formed on both sides so as to protrude from an outer peripheral surface of the basal portion 32a. A coupling pin 32d protrudes from the basal portion 32a at an eccentric position.

The coupling pin 32d of the linking member 32 is coupled to the coupling piece 21c so as to be reciprocable (or capable of reciprocating micro-motion) in a pin locking hole 21d formed on the coupling piece 21c of the base 21 of the touch panel device 20, as shown in FIGS. 2A to 3A. Due to the coupling between the coupling pin 32d and the coupling piece 21c, the linking member 32 rotates forward and backward around the support shaft 31 of the push operation mechanism 30 in conjunction with the push operation of the touch panel device 20. A portion of the coupling piece 21c opposite to the pin locking hole 21d is notched so as not to interfere with the tactile presenting device 40.

Structure of Tactile Presenting Device

The basic configuration in the first embodiment is the tactile presenting device 40 provided with a tactile presenting means which applies main vibration to the touch panel 24 as an operating portion and thereby provides an operational feeling to a finger of an operator. Therefore, the operating device 1 configured as described above is only a configuration example of the first embodiment, and shapes and structures of the components thereof are not limited to those of the illustrated example.

The tactile presenting device 40 is provided with a tactile presenting means for presenting tactile stimuli-operational feeling to a finger of an operator via the push operation mechanism 30. As shown in FIG. 1, the tactile presenting means is composed mainly of the linking member 32 of the push operation mechanism 30 and a drive transmission mechanism 41. The drive transmission mechanism 41 is provided with a driving portion and a cam mechanism.

As shown in FIG. 1, a motor 42 as the driving portion which can rotate forward and backward is held in a housing 44 which is fastened and fixed to the body 2 by non-illustrated screws. The motor 42 is electrically connected to the control board 7 via a terminal 45 having a cord electrically connected to the control board 7 and also via a ground clip 46 for discharging static electricity built up in the motor 42 to the ground circuit of the control board 7.

Meanwhile, as shown in FIG. 1, the cam mechanism is provided with a cam plate 43 as a rotating cam member which is fixed to an output shaft of the motor 42.

The state in which the push operation mechanism 30 is coupled to the tactile presenting device 40 on a constant basis is not preferable since the linking member 32 of the push operation mechanism 30 and the cam plate 43 of the tactile presenting device 40 act as a resisting force against the push operation of the push operation mechanism 30 and an operation feeling is thus impaired.

In the illustrated example, a structure to release the coupling between the linking member 32 and the cam plate 43 is provided. As shown in FIGS. 2A to 3C, the cam plate 43 is configured to be rotatable between a transmission position to transmit drive to the linking member 32 and a non-transmission position not to transmit drive to the linking member 32. When it is not necessary to generate a haptic feeling, the tactile presenting device 40 is stopped at a position away from the push operation mechanism 30.

As shown in FIGS. 2A to 3C, the cam plate 43 is a motion converting member which converts the oscillating rotary motion of the motor 42 into the reciprocating micro-motion of the touch panel device 20. On an outer surface of the cam plate 43, a first cam surface 43a is formed to have an involute curve.

The first cam surface 43a is configured to rotate at a predetermined angle while abutting against the linking member 32 at a cam follower surface 32e of the arm portion 32c which is located on the cam plate-facing side, as shown in FIGS. 2A to 3C.

Configuration of Drive Control Unit

Referring to FIG. 4, a configuration example of a drive control unit 100 for drive-controlling the tactile presenting device 40 is illustrated. The drive control unit 100 is composed of the control unit 110 and a drive circuit 120.

The control unit 110 is, e.g., a microcomputer having various components such as a CPU (Central Processing Unit) performing calculation and processing, etc., of the acquired data according to a stored program, a RAM (Random Access Memory) and a ROM (Read Only Memory) which are semiconductor memories, and has an analog signal output portion to output a drive control signal Vc generated by changing voltage and pulse width.

The motor 42 electrically-controlled by the drive control unit 100 is rotationally driven by a motor driving current Id which is supplied from the drive circuit 120 based on the drive control signal Vc output from the control unit 110, as shown in FIG. 4. The drive control signal Vc is generated based on a start pulse signal $P_{01}$ and a pre-vibration pulse signal $P_{02}$ with a predetermined number of pulses smaller than the pulse of the start pulse signal $P_{01}$.

The drive control unit 100 intermittently drives the motor 42 by the drive control signal Vc, as shown in FIG. 4. Based on a signal for a backlash eliminating operation performed to eliminate a gap (backlash) between the first cam surface 43$a$ of the cam plate 43 and the cam follower surface 32$e$ of the linking member 32, the motor 42 is driven by the drive control signal Vc until the first cam surface 43$a$ comes into contact with the cam follower surface 32$e$.

As shown in FIG. 4, coordinate information from the touch panel 24, push information from the push switch 5$b$ and angle information from the encoder 33 and the enter switch 34 are input to the control unit 110. The motor 42 is electrically-controlled via the drive circuit 120 based on such information and the stored information, and the backlash eliminating operation is thereby performed by the drive control signal Vc under the pre-vibration control from the state shown in FIG. 3A to the state shown in FIG. 3B.

Figure 3A:
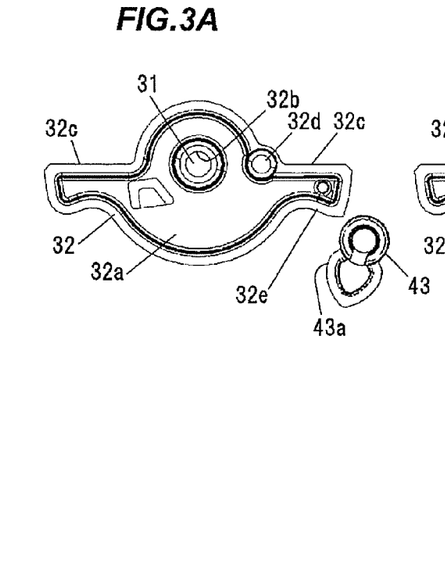
FIGS. 3A to 3C are diagrams corresponding to FIGS. 2A to 2C to show an operation of components of the tactile presenting device.
Figure 3B:
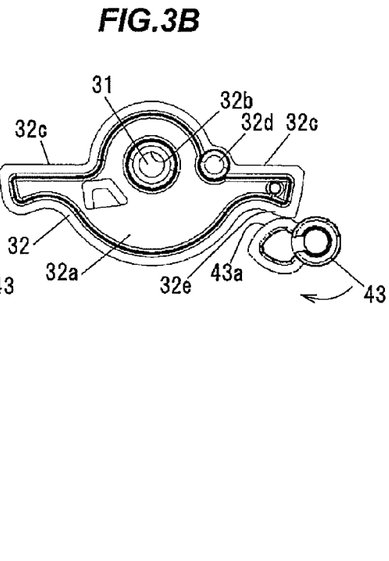
Figure 3C:
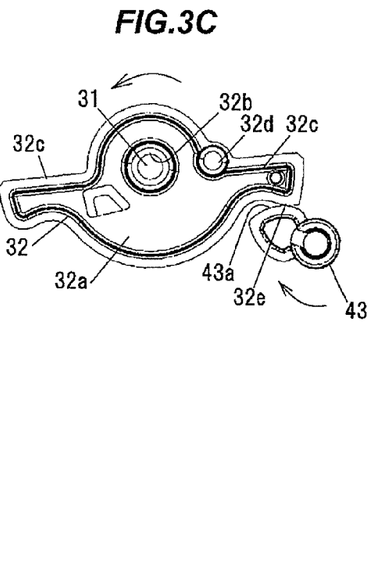

After the backlash eliminating operation, main vibration control to push up the touch panel 24 by a movement distance L is performed in a state that the first cam surface 43$a$ of the cam plate 43 is in contact with the cam follower surface 32$e$ of the linking member 32, as shown in FIG. 3C.

Operation of Drive Control Unit

Figure 5:
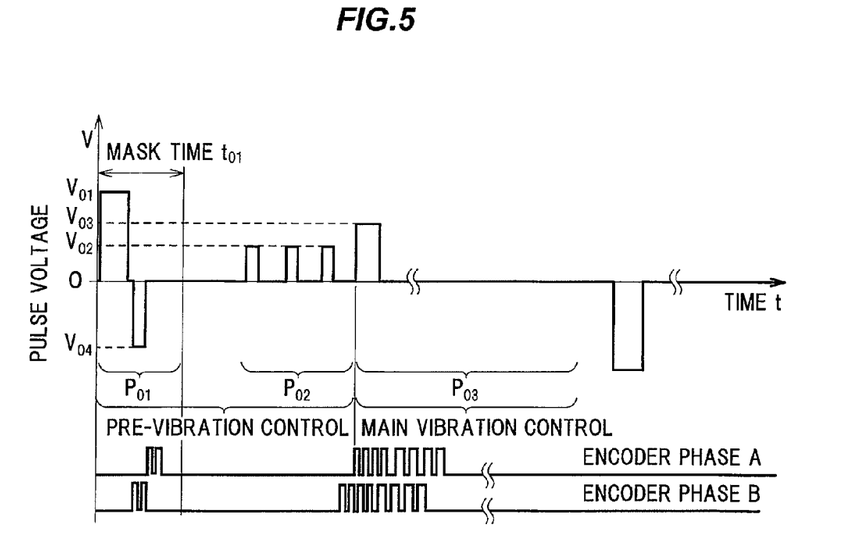
FIG. 5 is a diagram illustrating an example operation of the drive control unit.

Referring to FIG. 5, an example operation of the drive control unit 100 is illustrated. In FIG. 5, the drive control signal Vc is generated as a pulse train composed of the start pulse signal $P_{01}$ and the pre-vibration pulse signal $P_{02}$ with a predetermined number of pulses smaller than the pulse of the start pulse signal $P_{01}$. The drive control signal Vc is output as a main vibration pulse signal $P_{01}$ after completion of the backlash eliminating operation by the start pulse signal $P_{01}$ and the pre-vibration pulse signal $P_{02}$.

As shown in FIG. 5, the start pulse signal $P_{01}$ is a pulse signal to activate the motor 42 and is set to have a voltage value $V_{01}$ relatively larger than a voltage value $V_{03}$ of the main vibration pulse signal $P_{03}$ for transition from the state controlled by a static frictional force to the state controlled by a kinetic friction force. The positive voltage value $V_{01}$ for driving the motor 42 and a following negative voltage value $V_{04}$ are output as the start pulse signal $P_{01}$ and this allows excessive driving to be corrected.

On the other hand, as shown in FIG. 5, the pre-vibration pulse signal $P_{02}$ is a pulse train with a predetermined number of pulses set to have a voltage value $V_{02}$ which is smaller than the voltage value $V_{01}$ of the start pulse signal $P_{01}$. Considering variation between individual devices, operating temperature range and change over time, etc., the predetermined number of pulses is preferably determined so that the backlash eliminating operation is completed before the elapse of a certain period of time during which the predetermined start pulse signal $P_{01}$ and the pre-vibration pulse signal $P_{02}$ are generated.

The pre-vibration pulse signal $P_{02}$ can be configured as a pulse train of which voltage value or pulse width gradually increases. This configuration allows the backlash eliminating operation to be reliably carried out.

As shown in FIG. 5, the main vibration pulse signal $P_{03}$ is a pulse signal for applying main vibration to the touch panel 24. The voltage value $V_{03}$ or pulse width of the drive control signal to be sent to the drive circuit 120 is variably controlled according to the rotation amount of the encoder 33 which detects movement of the linking member 32 with which the touch panel 24 moves vertically.

The encoder 33 detecting the movement of the linking member 32 outputs two pulse signals out of phase with each other (Phase A and Phase B) to the control unit 110, as shown in FIG. 5. Since the phase difference (advance/delay) between the two phases is converted into an up-pulse when the signals are output, the output timing for upward movement of the touch panel 24 and that for downward movement are opposite to each other and the rotational direction and rotational position of the linking member 32 thus can be judged.

In the meantime, switching operation from the pre-vibration control to the main vibration control is controlled by the drive control signal sent from the control unit 110 to the drive circuit 120 based on the detection signal output from the encoder 33 detecting the movement of the linking member 32, without providing a sensor for detecting a rotation angle of the motor 42. Therefore, even when the linking member 32 moves in the state of not being in contact with the cam plate 43, it is regarded that the motor 42 is rotating at a predetermined angle in the contact state of the linking member 32 with the cam plate 43.

This is not preferable since it causes misjudgment of the control unit 110 and resulting switching from the pre-vibration control to the main vibration control, vibration under the main vibration control is then applied to the touch panel 24 via the linking member 32 and an operator feels something wrong with the operation of the touch panel 24.

Therefore, the main basic configuration in the first embodiment is that, in order to prevent misjudgment of the control unit 110, the control unit 110 has a mask time setting portion for providing mask time $t_{01}$ in which detection of the detection signal output from the encoder 33 is ignored for a certain period of time under the pre-vibration control during which the start pulse signal $P_{01}$ and the pre-vibration pulse signal $P_{02}$ are output. After the elapse of the mask time $t_{01}$, the control unit 110 switches to the output of the main vibration pulse signal $P_{03}$ based on the detection signal from the encoder 33.

As shown in FIG. 5, time from the start to the stop of the output of the start pulse signal $P_{01}$ is set as the predetermined mask time $t_{01}$ by the mask time setting portion, and a detection value of the detection signal output from the encoder 33 detecting the movement of the linking member 32 is ignored until the preset mask time $t_{01}$ elapses. Here, the detection value of the detection signal is the number of encoder pulses (hereinafter, referred to as "encoder value") output from the encoder 33.

The time of ignoring detection of the encoder value is set within the pre-vibration control area during which detection of the movement of the linking member 32, i.e., detection of the movement of the touch panel 24, is ignored. Therefore, even if the touch panel 24 moves in the pre-vibration control area in a state other than the state under the main vibration control in which the linking member 32 is in contact with the cam plate 43, the control unit 110 does not misjudge and incorrect switching operation from the pre-vibration control to the main vibration control is thus prevented.

Tactile Sensation Presenting Process by Drive Control Signal

Next, the process by the drive control unit 100 configured as described above will be described.

Figure 6:
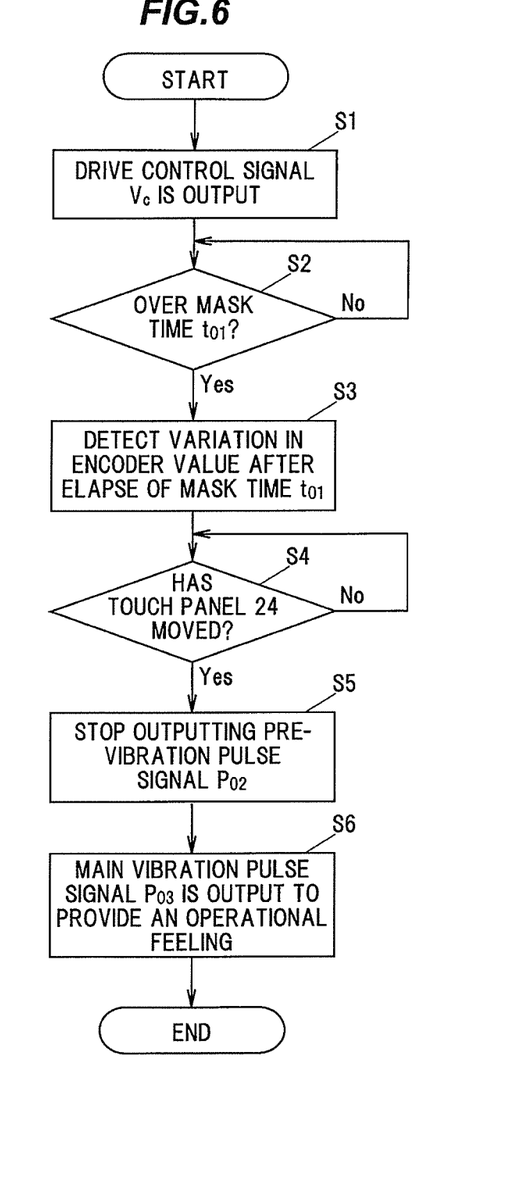
FIG. 6 is a flowchart showing a process example of the drive control unit.

Now, as shown in FIG. 6, operation of providing an operational feeling is initiated. Once the operational feeling providing operation is initiated, the control unit 110 of the drive control unit 100 outputs the drive control signal Vc, which is generated as a pulse train composed of the start pulse signal $P_{01}$ and the pre-vibration pulse signal $P_{02}$, to the drive circuit 120 (Step S1).

The control unit 110 outputs the drive control signal Vc to the drive circuit 120 and simultaneously monitors whether or not the mask time $t_{01}$ for invalidating the encoder value output from the encoder 33 has elapsed (Step S2). If the control unit 110 determines in the process of Step S2 that the mask time $t_{01}$ has not elapsed, then the process of Step S2 is repeated. If it is determined that the mask time $t_{01}$ has elapsed, then the process proceeds to the following Step S3.

The control unit 110 detects change in the encoder value after the elapse of the mask time $t_{01}$ in the process of Step S3 and thereby determines whether or not the linking member 32 has moved, i.e., whether or not the touch panel 24 has moved, after the elapse of the mask time $t_{01}$ (Step S4).

If the control unit 110 determines in the process of Step S4 that the touch panel 24 has not moved, then the backlash eliminating operation under the pre-vibration control is judged to be ongoing and the process of Step S4 is repeated. If it is determined that the touch panel 24 has moved, then the process proceeds to the following Step S5 for conducting the main vibration control.

In the process of Step S5, the control unit 110 stops outputting the pre-vibration pulse signal $P_{02}$. The backlash eliminating operation under the pre-vibration control from Steps S1 to S5 is thereby completed. Then, the process proceeds to Step S6.

In the process of Step S6, the control unit 110 outputs the main vibration pulse signal $P_{01}$ as the drive control signal to the drive circuit 120 and an operational feeling is provided under the main vibration control which is carried out to push up the touch panel 24. Through the above processes, the operational feeling presentation by a series of motor drive from Steps S1 to S6 is completed.

Effects of the First Embodiment

Use of the operating device 1 configured as described above provides the following effects in addition to the above-mentioned effects.

(1) By ignoring the movement of the linking member 32, i.e., the movement of the touch panel 24, during a certain period of time since the initiation of the vibration control, it is possible to prevent misjudgment of the control unit 110 prior to the main vibration control.

(2) Since the misjudgment prior to the main vibration control can be prevented, it is possible to stabilize the information presentation operation.

(3) Since it is possible to prevent switching to the main vibration control during the pre-vibration control, it is possible to reduce vibration which makes an operator to feel something wrong with the operation of the touch panel 24.

(4) Since the drive control signal Vc is composed of the start pulse signal $P_{01}$ and the pre-vibration pulse signal $P_{02}$ with a predetermined number of pulses smaller than the pulse of the start pulse signal $P_{01}$, it is possible to suppress impact noise or unwanted vibration, etc., caused by the backlash eliminating operation and thus possible to reduce occurrence of impact noise or unwanted vibration, etc., during or before the vibration applying operation.

(5) It is possible to effectively obtain a configuration which allows a haptic feeling to be generated only in a necessary direction when tactile feedback is needed.

(6) It is possible to reduce cogging torque of the motor 42 and it is thus possible to drive with less impact noise and vibration, etc., associated with the cogging torque.

Second Embodiment

Figure 7:
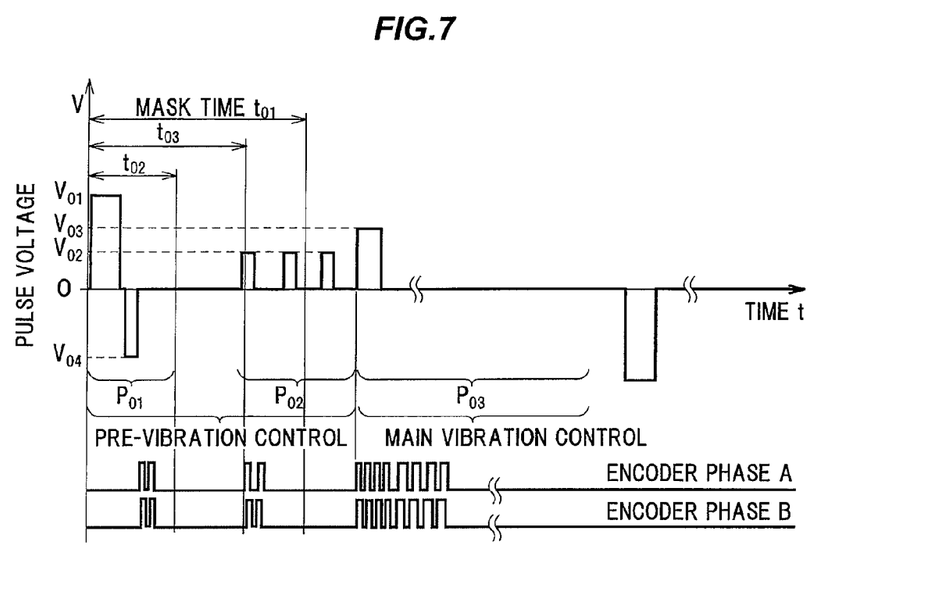
FIG. 7 is a diagram illustrating an example operation of the drive control unit of the tactile presenting device in a second embodiment.
Figure 8:
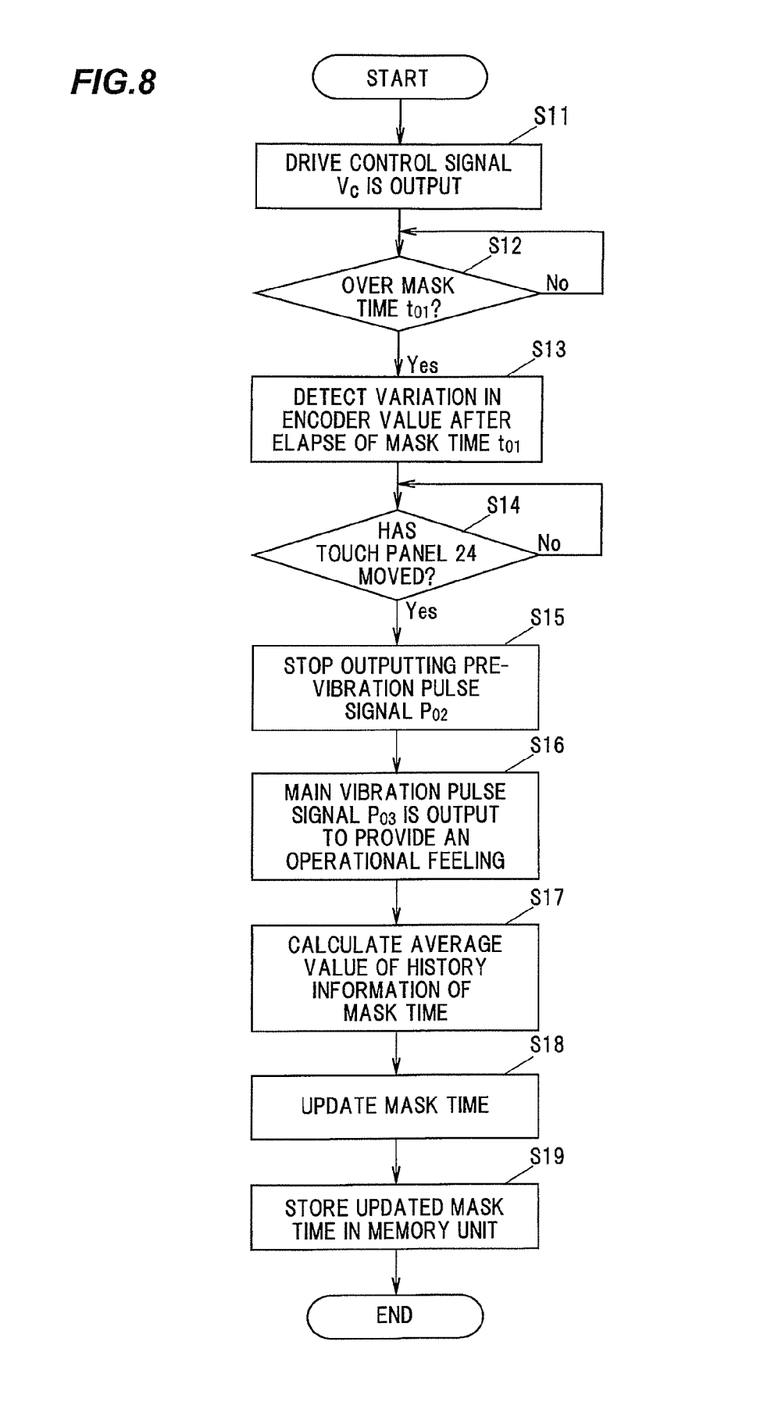
FIG. 8 is a flowchart showing a process example of the drive control unit of the tactile presenting device in the second embodiment.

Referring to FIGS. 7 and 8, the operation and process of the control unit 110 of the tactile presenting device 40 in the second embodiment are respectively illustrated as an example.

The second embodiment is the same as the first embodiment except that the mask time $t_{01}$ for invalidating the encoder value output from the encoder 33 detecting the movement of the linking member 32 is updated. Therefore, detailed descriptions for members denoted by the same reference numerals as those in the first embodiment will be omitted.

Operation of Drive Control Unit

If a first mask time $t_{02}$ is the fixed time, too short fixed time is not preferable since an operator feels something wrong with the operation of the touch panel 24 when the timing to start the main vibration control is misjudged during the pre-vibration control in an area in which mask time is not provided. Conversely, too long fixed time is also not preferable since the operator feels something wrong with the operation of the touch panel 24 due to delay of switching operation from the pre-vibration control to the main vibration control.

The main basic configuration in the second embodiment is that the control unit 110 of the drive control unit 100 has a mask time updating means which updates the mask time $t_{01}$ provided by the mask time setting portion. Accordingly, the switching operation from the pre-vibration to the main vibration is stably controlled with high accuracy.

As for the mask time $t_{01}$, time from the start to the stop of the output of the start pulse signal $P_{01}$ is set as the first mask time $t_{02}$ and time from the start of the output of the start pulse signal $P_{01}$ to the start of the output of the pre-vibration pulse signal $P_{02}$ is set as a second mask time $t_{03}$, as shown in FIG. 7.

As shown in FIG. 7, the mask time updating means fixes the first mask time $t_{02}$ to a certain period of time as the minimum value (minimal time) of the mask time $t_{01}$, stores the second mask time $t_{03}$ after the elapse of the first mask time $t_{02}$ as history information, and calculates an average value of the last n times of the history information to update the mask time $t_{01}$.

By the mask time updating means, time until change to $(Hfb_1-Hfb_0)>Hfb_{ST}$ occurs is set as the second mask time $t_{03}$, where $Hfb_0$ is an encoder value at a point during the first mask time $t_{02}$, $Hfb_1$ is an encoder value at a point during the second mask time $t_{03}$ and $Hfb_{ST}$ is an encoder value after the elapse of the second mask time $t_{03}$.

The mask time $t_{01}$ is preferably set as time resulting from updating a value which is derived by subtracting time X (millisecond) from the average value of the last n times of the second mask time $t_{03}$. Here, the X (millisecond) is a correction value for correcting, e.g., time difference (time lag) from the moment when the linking member 32 comes into contact with the cam plate 43 to the moment when the linking member 32 moved.

In the illustrated example, the mask time $t_{01}$ is set to be longer than the first mask time $t_{02}$ and the second mask time $t_{03}$ which is longer than the first mask time $t_{02}$, however, in case that, e.g., the minimal time of the mask time $t_{01}$ is set as the first mask time $t_{02}$ (the mask time $t_{01}$=the first mask time $t_{02}$), the average value of the last n times of the second mask time $t_{03}$ is the mask time $t_{01}$ (the average value of the last n times of the second mask time $t_{03}$=the mask time $t_{01}$).

When the encoder value $Hfb_1$ during the second mask time $t_{03}$ is greater than the encoder value $Hfb_{ST}$ after the elapse of the second mask time $t_{03}$, the pre-vibration control is switched to the main vibration control. On the other hand, when the encoder value $Hfb_1$ during the second mask time $t_{03}$ is less than the encoder value $Hfb_{ST}$ after the elapse of the second mask time $t_{03}$, the pre-vibration control is not switched to the main vibration control. In this regard, however, when the encoder value changes to $(Hfb_1-Hfb_0)$ > $Hfb_{ST}$ during the mask time $t_{01}$, the pre-vibration control is immediately switched to the main vibration control.

The mask time updating means configured as described above calculates a new updated mask time $t_{01}$ using the average value of the last n times of the second mask time $t_{03}$, and this allows the mask time $t_{01}$ to be appropriately changed.

Tactile Sensation Presenting Process by Drive Control Signal

Next, the process by the drive control unit 100 configured as described above will be described.

Now, as shown in FIG. 8, operation of providing an operational feeling is initiated. Once the operational feeling providing operation is initiated, the control unit 110 of the drive control unit 100 outputs the drive control signal Vc, which is generated as a pulse train composed of the start pulse signal $P_{01}$ and the pre-vibration pulse signal $P_{02}$, to the drive circuit 120 (Step S11).

The control unit 110 outputs the drive control signal Vc to the drive circuit 120 and simultaneously monitors whether or not the mask time $t_{01}$ for invalidating the encoder value output from the encoder 33 has elapsed (Step S12). When the control unit 110 determines in the process of Step S12 that the mask time $t_{01}$ has not elapsed, the process of Step S12 is repeated. When it is determined that the mask time $t_{01}$ has elapsed, the process proceeds to the following Step S13.

The control unit 110 detects change in the encoder value after the elapse of the mask time $t_{01}$ in the process of Step S13 and thereby determines whether or not the linking member 32 has moved, i.e., whether or not the touch panel 24 has moved (Step S14).

When the control unit 110 determines in the process of Step S14 that the encoder value $Hfb_1$ during the second mask time $t_{03}$ is less than the encoder value $Hfb_{ST}$ after the elapse of the second mask time $t_{03}$ and the touch panel 24 has not moved, it is determined that the backlash eliminating operation under the pre-vibration control is ongoing and the process of Step S14 is repeated without switching from the pre-vibration control to the main vibration control.

When it is determined that the encoder value $Hfb_1$ during the second mask time $t_{03}$ is greater than the encoder value $Hfb_{ST}$ after the elapse of the second mask time $t_{03}$ and the touch panel 24 has moved, the process proceeds to the following Step S15.

In the process of Step S15, the control unit 110 stops outputting the pre-vibration pulse signal $P_{02}$ after the elapse of the second mask time $t_{03}$. The backlash eliminating operation under the pre-vibration control from Steps S11 to S15 is thereby completed. After completion of the backlash eliminating operation, the process proceeds to the following Step S16.

In the process of Step S16, the control unit 110 outputs the main vibration pulse signal $P_{03}$ as the drive control signal to the drive circuit 120 and an operational feeling is provided under the main vibration control which is carried out to push up the touch panel 24. Through the above processes, the operational feeling presentation by a series of motor drive from Steps S11 to S16 is completed and the process proceeds to the following Step S17.

In the process of Step S17, the second mask time $t_{03}$ is stored as history information and the average value of the last n times of the second mask time $t_{03}$ is calculated. In the processes of the following Steps S18 and S19, after the updating process of the second mask time $t_{03}$, the calculated average second mask time $t_{03}$ is stored as history information in a memory unit of the control unit 110.

Through the above processes, the operational feeling presentation by a series of motor drive from Steps S11 to S19 is all completed.

Effects of the Second Embodiment

In the second embodiments, the same effects as the first embodiment are also obtained. In addition, the following effects are obtained.

(1) Updating the second mask time $t_{03}$ each time after applying vibration allows frequency of occurrence of strange operational feeling to be reduced without being affected by individual variability and change of environment.

(2) Since the average value of the last n times of the second mask time $t_{03}$ is an updated value which is used as a new mask time $t_{01}$, it is possible to reduce a rotational position error of the linking member 32.

Modifications

In the operating device 1 of the invention, the following modifications can be also implemented.

(1) It is obvious that the above-mentioned tactile presenting means is applicable not only to on-vehicle equipments but also to various terminal units, e.g., game consoles, personal computers and mobile phones, etc.

(2) It is possible to present tactile stimuli-operational feeling to a finger of an operator even in various switching devices not provided with a touch panel and the above-mentioned tactile presenting means is also applicable to, e.g., mouse devices, keyboards and control knobs, etc.

(3) The number, position and arrangement of the above-mentioned tactile presenting means can be appropriately selected depending on, e.g., the intended use, etc., to achieve the initial object of the invention.

Although typical embodiments, modifications and illustrated examples of the invention have been described, the invention according to claims is not to be limited to the embodiments, modifications and illustrated examples, as obvious from the above description. Therefore, it should be noted that all combinations of the features described in the embodiments, modifications and illustrated examples are not necessary to solve the problem of the invention.

What is claimed is:

1. An operating device, comprising:
   a push operation mechanism comprising an operating portion to be push-operated;
   a tactile presenting means that drives the operating portion by a driving portion via the push operation mechanism to provide an operational feeling;

a detecting portion for detecting movement of the operating portion; and a drive control unit that drives the driving portion by a drive control signal and a main vibration pulse signal output after outputting the drive control signal, the drive control signal being generated based on a start pulse signal and a pre-vibration pulse signal with a predetermined number of pulses smaller than the pulse of the start pulse signal, wherein the drive control unit sets a mask time to ignore a detection signal of the detecting portion in a certain period when the drive control signal is output and switches from the output of the drive control signal to the output of the main vibration pulse signal based on a detection signal of the detecting portion after an elapse of the mask time, and wherein the mask time is set to be a second mask time, where a first mask time elapsing from a start to a stop of an output of a start pulse signal is a minimum time and the second mask time is a time more than the minimum time.

2. The operating device according to claim 1, wherein the second mask time is a time elapsing from the start of the output of the start pulse signal to a start of an output of a pre-vibration pulse signal, and wherein the second mask time is updated by an average value calculated from a last number n times of stored history information of the second mask time.

3. The operating device according to claim 1, wherein the second mask time is set to be a time until change to (Hfb1−Hfb0)>HfbST occurs, where Hfb0 is a value detected by the detecting portion at a point during the first mask time, Hfb1 is a value detected by the detecting portion at a point during the second mask time and HfbST is a value detected by the detecting portion after elapse of the second mask time.

4. The operating device according to claim 1, wherein the drive control unit controls such that the main vibration pulse signal is output when a value Hfb1 detected by the detecting portion at a point during the second mask time is greater than a value HfbST detected by the detecting portion after elapse of the second mask time, and the main vibration pulse signal is not output when the value Hfb1 detected by the detecting portion at a point during the second mask time is less than the value HfbST detected by the detecting portion after elapse of the second mask time.

5. The operating device according to claim 2, wherein the mask time is set as time resulting from updating a value that is derived by subtracting a correction value from the average value of the second mask time.

6. The operating device according to claim 1, wherein the operating portion comprises a touch panel.

7. The operating device according to claim 1, wherein the push operation mechanism comprises the detecting portion.

8. The operating device according to claim 1, wherein the detecting portion comprises an encoder to detect a position of the push operation mechanism and an enter switch to detect presence of push operation to the push operation mechanism.

9. The operating device according to claim 1, wherein the switching from the output of the drive control signal to the output of the main vibration pulse signal is conducted only based on a detection signal of the detecting portion.

10. The operating device according to claim 1, wherein the drive control unit provides no vibration pulse signal during the mask time.

* * * * *

UNITED STATES PATENT AND TRADEMARK OFFICE
CERTIFICATE OF CORRECTION

PATENT NO. : 9,454,232 B2  
APPLICATION NO. : 14/455226  
DATED : September 27, 2016  
INVENTOR(S) : Murata It is certified that error appears in the above-identified patent and that said Letters Patent is hereby corrected as shown below:

On the Title Page

Item [30], insert:
--JP 2013-189041 filed September 12, 2013--

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*